United States Patent [19]

Lim et al.

[11] Patent Number: 5,670,391
[45] Date of Patent: Sep. 23, 1997

[54] PROCESS FOR REDUCING TRANSIENT DIFFUSION OF DOPANT ATOMS

[75] Inventors: Desmond R. Lim, Singapore, Singapore; Conor Stefan Rafferty, Summit, N.J.

[73] Assignee: Lucent Technologies Inc., Murray Hill, N.J.

[21] Appl. No.: 511,845

[22] Filed: Aug. 7, 1995

[51] Int. Cl.$^6$ ............................................. H01L 21/265
[52] U.S. Cl. ........................... 437/25; 437/20; 437/16; 437/939; 437/950; 148/DIG. 144
[58] Field of Search ........................... 437/16, 20, 25, 437/939, 950; 148/DIG. 144

[56] References Cited

PUBLICATIONS

Hopkins et. al.,; "Enhanced Diffusion in Boron Implanted Silicon"; J. Electrochemical Society: Accelerated Brief Communication; Aug. 1985; pp. 2035–2036.

Michel; "Rapid Annealing and the Anomalous diffusion of ion Implanted Boron into Silicon"; Appl. Phys. Leter. vol. 50, No. 7, Feb. 1987; pp. 416–418.

Fair; "Modeling Rapid Thermal Diffusion of Arsenic and Boron in Silicon" J. Electrochem. Soc: Solid–State Science and Tech; vol. 131, No. 10; Oct. 1984; pp. 2387–2394.

Huang et al; "Enhanced Tail Diffusion of Ion Implanted Boron in Silicon" Appl. phys. Letters; vol. 50(24), Jun. 1987, pp. 1745–1747.

Fan et al.; "Reduction of transient–enhanced diffusion of boron in silicon by implantation through oxide"; Appl. phys. Lett. 54(7); Feb. 1985; pp. 603–605.

Huang et al. "Reverse Annealing and Low–temperature Diffusion of Boron in Boron–implanted Silicon"; J. App. Phys 63(11); Jun. 1988; pp. 5521–5525.

Primary Examiner—Trung Dang

[57] ABSTRACT

Transient enhanced diffusion (TED) of dopants is reduced by bring the surface closer to the implant damage prior to the annealing process.

8 Claims, 3 Drawing Sheets

PROCESS FOR REDUCING TRANSIENT DIFFUSION OF DOPANT ATOMS

FIELD OF INVENTION

The invention relates to a process for fabricating devices and, in particular, a process for reducing transient diffusion of dopant atoms.

BACKGROUND OF INVENTION

In device fabrication, dopant or impurity atoms are introduced into the semiconductor material to alter its electrical conductivity. One technique of introducing dopants into the semiconductor material is ion implantation. During ion implantation, a beam containing ions, which are typically extracted from a plasma, is directed at the surface of the semiconductor material (target). As the ions enter the material, they collide with the target atoms and come to rest at an average depth in the substrate. The average depth at which the ions are distributed varies with implant energy as well as with the target material and the specie of ion being implanted. For a given target material and ion specie, higher energy generally corresponds to a deeper penetration of the ions into the material. The dose or the total number of ions entering the target is controlled by monitoring the ion current during implantation as well as the time of implantation.

The ion distribution or profile n(x) resulting from the implantation, in general, can be characterized by the following Gaussian distribution:

$$n(x) = n_0 \exp\left[ \frac{-(x-R_p)}{2\sigma_p^2} \right]$$

where $n_0$ is the peak concentration of the implanted ions (i.e., peak of the profile) which occurs at $R_p$, the projected range or the average depth of the implanted ions, and $\sigma_p$ is the standard deviation of the distribution of the ions about the average depth $R_p$.

However, ion implantation produces an undesirable side effect. The impinging ions during implantation displace the target atoms, creating damage in the crystal lattice structure of the target. Such damage is, for example, in the form of vacancies, (i.e., holes or vacant lattice sites) and interstitials (i.e., atoms occupying interstices between normal lattice sites) which are referred to as point defects. In some instances, the severity of this damage may transform the material into an amorphous structure. Annealing is also required to electrically activate the implanted region by placing the dopant atoms on substitutional sites.

High temperature cycles, such as annealing, cause appreciable diffusion of the dopants, thereby altering the impurity profile. With the reduction of device sizes to the submicron range, diffusion of dopant atoms needs to be closely controlled. Techniques such as rapid thermal annealing (RTA) have been used to reduce diffusion of dopants while repairing the implant damage. RTA refers to various techniques of heating the material for short periods of time, e.g. in the order of seconds.

However, even when RTA is used, a phenomenon known as transient enhanced diffusion (TED) has been observed during the post-implant annealing process. TED refers to the increase in the effective diffusion rate of the dopants over the first few seconds of annealing. In some cases, TED increases the diffusion rate by a factor of 10 to 1000. Although the physical mechanism of TED is not fully understood, it is widely thought to be caused by excess interstitials (point defects) generated by the implant.

Clearly, TED makes it difficult to control the implant profile. In the past, this was not an issue which overly concerned device manufacturers because the resulting diffusion of dopants was considered to be within tolerable limits. But as technology now enables device size to shrink below submicron dimensions, the effects of TED become more pronounced. For example, in MOS devices, lateral diffusion of the drain and source implants adversely affects the threshold-adjust implant at the gate region even though these regions are separated by, for example, several tenths of microns. This results in an increase in gate threshold voltage $V_T$ which controls the conduction path between the source and drain as device size decreases (i.e., reverse short channel effect). TED also causes impurity atoms to pile up at the surface in high concentration. This pileup degrades channel mobility as it inhibits the movement of electrons between the drain and the source, thereby decreasing the speed of the device. In addition, submicron devices require ultra shallow junctions having depths of, for example, less than 1000 angstroms (Å) to maintain low contact resistance. Vertical diffusion of dopants resulting from TED makes it difficult to achieve the shallow implant profiles necessary for such devices.

From the above discussion, it is apparent that there exists a need to effectively reduce TED during post-implant annealing of the semiconductor material.

SUMMARY OF INVENTION

The invention is directed to a process for fabricating a device including the step of reducing the enhanced diffusion of dopant atoms that occurs during post-implant anneal. Prior to annealing the wafer, the surface of the implanted region is etched to bring it closer to the implant damage. The etch process should be controlled to prevent etching the surface significantly beyond about the peak of the implant profile in order to avoid removing most of the dopants. By bringing the surface closer to the implant damage, the effects of TED during post-implant annealing are significantly reduced.

DETAILED DESCRIPTION OF THE INVENTION

Figure 1A:
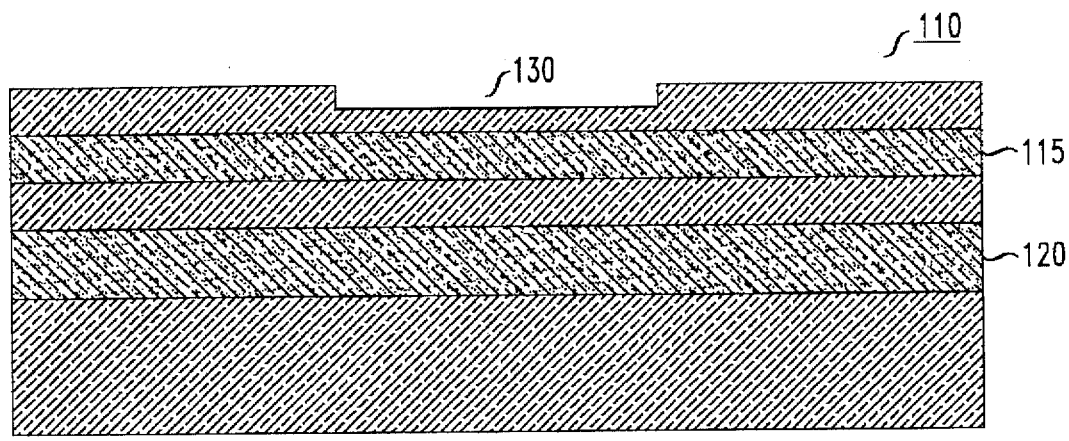
FIGS. 1a–1b illustrate the effect of surface proximity on TED.

The present invention relates to a process for fabricating a device including the step of controlling the diffusion of dopants, e.g., boron (B), phosphorus (P), arsenic (As), antimony (Sb). For purposes of illustration, the invention will be described in the context of MOS devices. However, the invention is significantly broader and extends to the fabrication of devices in general, such as bipolar devices, BiCMOS, thin film transistors, heterojunction devices, and the like.

A typical MOS transistor, which is fabricated by conventional techniques such as those described in S. M. Sze, "VLSI Technology", 2nd ed., New York: McGraw-Hill, 1988, incorporated herein by reference for all purposes, comprises a gate, source, and drain regions. The transistor is formed on a semiconductor substrate which, for example, can be a silicon wafer prepared by the Czochralski technique. The major surface of the wafer is not critical and any suitable orientation such as an (100), (110), or (111) is useful. It is possible to heavily or lightly doped with impurity atoms to achieve the desired electrical characteristics.

An oxide layer is then formed on the surface of the wafer by, for example, thermal oxidation. It forms the gate oxide which serves to facilitate the projection of electrical fields into the channel. Dopant atoms are implanted into the region at which the gate is to be formed. This implant is referred to as the threshold-adjust implant and is used to set the threshold voltage at the gate. A doped-polysilicon layer is then formed on the substrate to define the gate. Various techniques, such as physical deposition, chemical vapor deposition, or epitaxial growth, are used to perform this step. After the gate is created, dopant atoms are implanted into regions next to the gate to form the source and drain. The wafer is then annealed to repair the implant damage and to activate the dopants. Finally, metal and phosphorous-doped silicon dioxide (P-glass) layers are formed. The metal provides the necessary connections while the P-glass serves as an intermediate dielectric to isolate the metal interconnect level from the polysilicon. The patterning of the various layers for selective formation on the wafer are achieved using photolithographic and etching techniques.

The above is an overly simplified description of the process sequence involved in the fabrication of a MOS transistor for purposes of illustration. Of course, the actual fabrication of the MOS transistor involves many more steps, such as, for example, steps for forming field oxide, n-tub, p-tub, and contacts for source and drain. These steps are well-known and are described in S. M. Sze, "VLSI Technology".

In accordance with the present invention, TED is reduced by moving the surface of the implanted region closer to the implant damage prior to the annealing process. While not wishing to be bound by theory, a contemplated explanation for the reduction of TED is that interstitials are strongly attracted to the surface (i.e., surface is a strong recombination sink for interstitials). By bringing the surface closer to the damage, interstitials in the substrate (bulk) migrates to the surface. As a result, the concentration of interstitials available for facilitating TED in the bulk is significantly reduced.

Moving the surface closer to the implant damage within the invention, i.e., removing an amount of the surface, can be achieved by conventional techniques such as reactive ion etching (RIE). Such techniques are well-known and are described in S. M. Sze, "VLSI Technology". Alternatively, other applicable etching techniques include reactive sputter etching (RSE), reactive ion beam etching (RIBE), wet (chemical) etching, microwave plasma etching, and the like which have operating temperatures below that sufficient to trigger dopant diffusion (typically less than about 450° C.). Such techniques are also described in S. M. Sze, "VLSI Technology".

The requisite for moving the surface to reduce TED is required only in regions where silicon damage is present, i.e., regions where dopants are implanted. Conventional patterning techniques such as those described in S. M. Sze, "VLSI Technology", are employed to selectively expose regions to be etched. For example, an energy-sensitive resist layer is applied to the surface of the wafer. Using a mask containing the desired pattern, selected regions on the wafer are then exposed to, for example, radiation which causes a chemical change to the exposed regions. Next, a solvent that removes the exposed and unexposed regions at different rates is used to either remove the exposed or unexposed region to form a pattern for etching. In some instances, the topography of the wafer provides a natural pattern for certain process steps, thereby eliminating the need for a resist layer. For example, the source/drain implant is achieved by choosing the inplant energy so that the dopants penetrate the thin gate oxide, but will not penetrate the polysilicon gate or field oxide. Likewise, the etchant for the etch process is selected to react with the gate oxide and substrate beneath it, but not the polysilicon gate or field oxide.

Although the etch depth may vary depending on the application, it should not significantly exceed about the average depth of the implanted ions (Rp). As previously discussed, the average depth of the implant represents the depth at which the peak concentration of implanted ions is located (i.e., peak of the implant profile). Preferably, the etch depth should be between about 10% of the average depth of the implant to the average depth of the implant. More preferably, the etch depth is between about 10 to 80% of the average depth of the implant, even more preferably, the etch depth is between about 20 to 80% of the average depth of the implant, and most preferably, the etch depth is between about 30 to 70% of the average depth of the implant. Although etching the surface significantly beyond the peak of the implant profile eliminates most of the damage, it also removes a significant percentage of the dopant atoms which defeats the purpose of the implantation step. As such, the etch process should be controlled precisely to prevent etching significantly beyond about the peak of the implant profile. Factors such as etch species and etch rate should be considered in order to select the correct etching parameters. These factors of course will depend on the specific etch application, such as the type and thickness of the mask or material being etched.

Etching the surface of the implanted regions in accordance with the present invention reduces reverse short channel effect, that is, the increase in gate threshold voltage $V_T$ as with the decrease in device size. In accordance with the present invention, the surface of the implanted region should be etched an effective amount to reduce short channel effect to within about 30 to 300 millivolts (mV). Preferably, the surface is etched an effective amount to reduce the reverse short channel effect to within about 50 to 250 mV. More preferably, the surface of the implanted region is etched an effective amount to reduce reverse short channel effect to within about 75 to 200 mV, and most preferably, the surface of the implanted region is etched an effective amount to reduce reverse short channel effect to within about 100 to 150 mV.

Figure 1B:
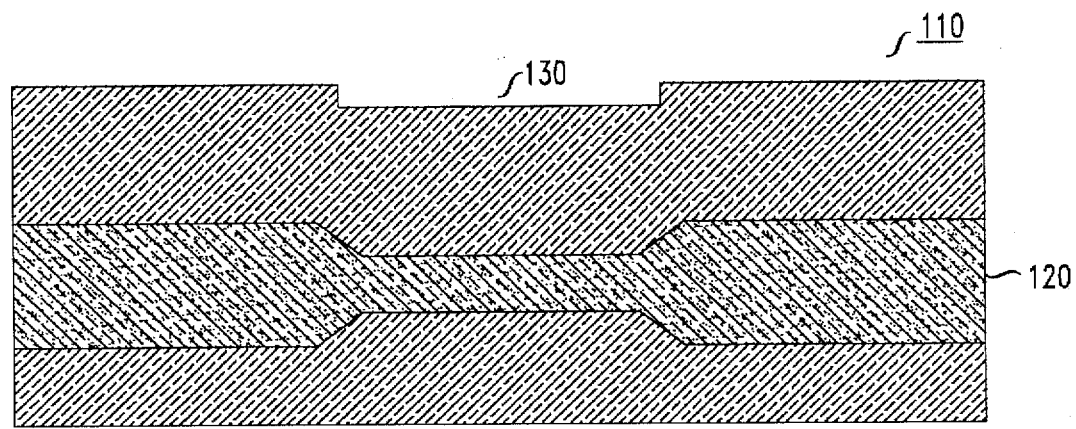

Referring to FIG. 1a, a substrate 110 having regions 115 and 120 comprising boron and silicon damage, respectively, is shown. The surface of the substrate at region 130 was removed by RIE to bring the surface closer to the silicon damage. FIG. 1b illustrates the substrate of FIG. 1a after being annealed at 800° C. for 120 min. Clearly, the region 130 of the substrate where the surface has been etched exhibited less broadening of the boron profile. Thus, FIGS. 1a–1b show that surface proximity to implant damage reduces TED.

EXAMPLE

In order to study the effect which the surface has on TED, the following boron diffusion marker was prepared. A $1\times10^{13}$ cm$^{-2}$ dose of boron (B$^+$) was implanted at an energy of 200 KeV into 10–20 p-type float-zone (FZ) silicon wafers. The samples were then annealed at 1000° C. for one minute in Ar to remove the damage caused by the boron implant. Subsequently, a $2.7\times10^{13}$ cm$^{-2}$ dose of silicon (Si$^+$) was implanted at an energy of 180 keV to create silicon damage. The boron dose was chosen so that the diffusion would be intrinsic at 800° C. while the dose of the silicon implant was chosen so that no stable extended defects would be formed. Such a sample, as will be shown, is effective in decoupling the damage being etched away from the effect of moving the surface closer to the damage.

After the silicon implant, the samples were cleaned and 1 μm of tetraethylorthosilicate (TEOS) was deposited at a temperature of 435° C. using a plasma enhanced chemical vapor deposition (CVD) process. The TEOS serves as a hard mask to the RIE of the silicon. The TEOS was patterned and a Cl$_2$ RIE was performed in the windows to etch back the silicon. The samples were etched back to depths of 650 Å, 1000 Å, 1250 Å, 1750 Å, and 2500 Å. Windows were used instead of a blanket etch to ensure that the etch depth could be calibrated and measured.

The depth of the etch was calibrated using three separate techniques. First, the total oxide/silicon step was measured immediately after RIE with a profilometer. Since the TEOS thickness was known, the amount of silicon etched can be determined. Secondly, the etch steps were measured directly after TEOS removal with a profilometer. Thirdly, the relative position of the boron peaks to the surface in unannealed samples was used to determine the etched depth. The three techniques yielded etch depths within 100 Å of one another.

The remaining TEOS was stripped in HF to ensure that the surface of both the etched and unetched regions of the wafer were similar. The samples were then cleaned and annealed at a temperature of 800° C. for 2 hours in Ar. Boron profiles of the samples before and after annealing were measured using secondary ion mass spectroscopy (SIMS).

Figure 2:
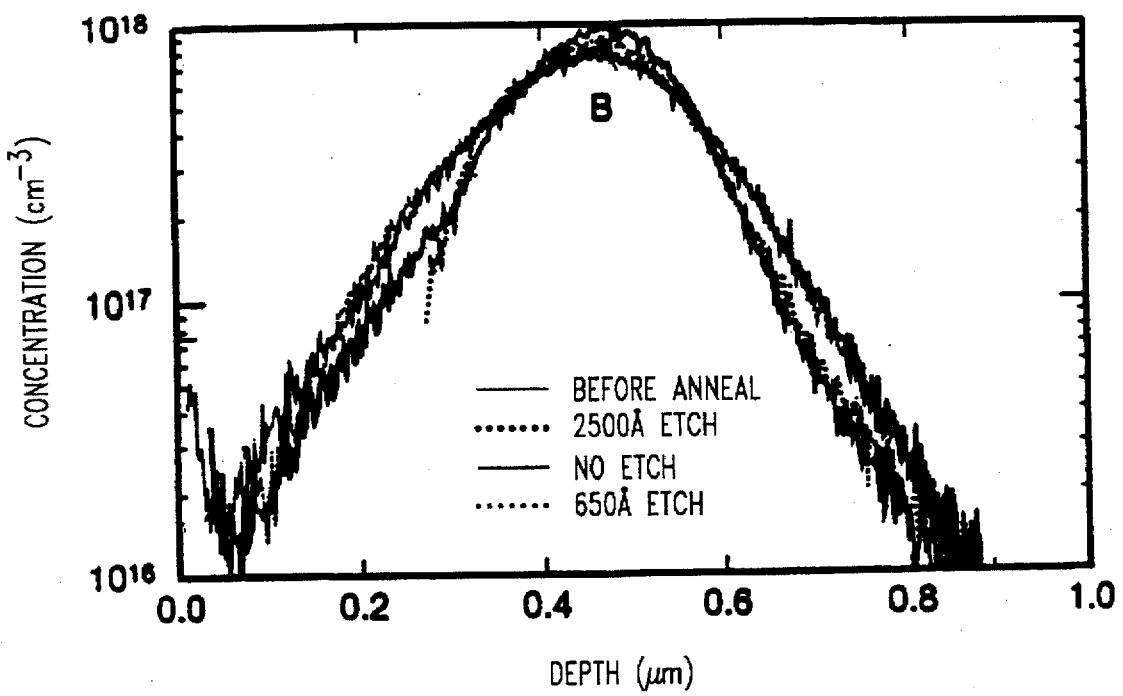
FIG. 2 graphically depicts secondary ion mass spectroscopy measurements of the depth distribution of boron diffusion profiles in the substrate.

FIG. 2 illustrates SIMS-measurements of boron profiles from control and annealed test samples etched at 650 Å and 2500 Å. Although the measurements from the other samples are available, their profiles lie between the annealed and the unetched cases and thus have been omitted for clarity. From a visual inspection of the profiles, it is clear that as the surface is brought closer to the damage, i.e., increased etch depth, diffusion of boron is decreased.

A SIMS analysis was performed on the profiles to determine the boron diffusion lengths. Diffusion length (L), in general, is related to diffusivity (D) as follows:

$$L=\sqrt{Dt}$$

From the equation, it is clear that an enhancement in diffusivity by a factor of 100 causes an enhancement in diffusion length by a factor of 10. The boron diffusion lengths were obtained by optimizing the boron diffusivity $D_B$ so that the Gaussian broadening with that diffusivity transformed the measured implanted profile into the measured diffused profile. Such procedure is described in H. J. Gossman et al., "Diffusion of dopants in B- and SG-delta-doped Si films grown by solid-phase epitaxy", *J. Appl. Phys.* 74, p3150 (1993), incorporated herein by reference for all purposes.

Figure 3:
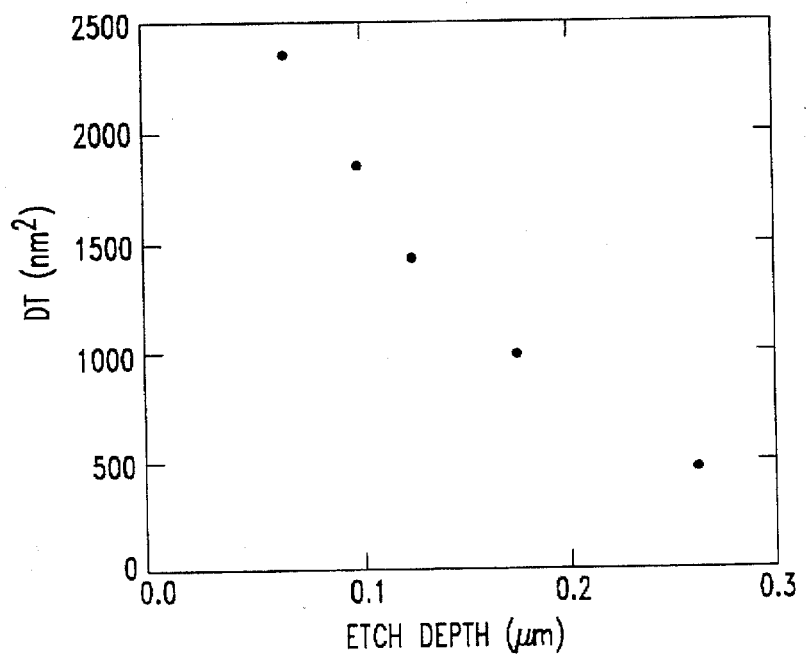
FIG. 3 graphically depicts the broadening of the diffusion profile as the surface is brought closer to the damage.

Referring to FIG. 3, the results of the SIMS analysis are shown. The analysis yielded a diffusion length of about 500 Å for the unetched annealed sample. This value evidences that the annealing process enhanced the diffusion of boron as the equilibrium diffusion length for the stated anneal process is only about 54 Å. This increased diffusivity is believed to be caused by the excess injection of interstitials from the implantation step.

A diffusion length of about 430 Å was determined for the 650 Å etched sample. This slight reduction between the unetched and 650 Å etched samples confirms that the RIE process did not contribute to TED. As such, the effect of etching the damage was effectively decoupled from the effect of moving the surface closer to the damage.

As for the 2500 Å etched sample, a diffusion length of less than 200 Å was calculated, showing a significant reduction in diffusion length. Since diffusion length is related to the square root of diffusivity, this implies the reduction of diffusion length from 500 Å to 200 Å corresponds to a decrease in boron diffusivity by at least a factor of six. This result suggests that the surface is a strong recombination sink, as will be clear by the following discussion.

For boron, the ratio of diffusivity can be modeled by as follows:

$$D_B = D_B^* \frac{I}{I^*}$$

where $D_B$ is the diffusivity of boron, $D^*_B$ is the equilibrium diffusivity of boron, I is the concentration of interstitials, and I* is the equilibrium concentration of interstitials. A description of point defect diffusion modeling can be found in P. M. Fahey et al., "Point Defects of Dopant Diffusion in Silicon", *Reviews of Modern Physics*, Vol. 61 (2) 289 (1989), incorporated herein by reference for all purposes. From the above equation, the factor of six decrease in boron diffusivity requires a concomitant factor of six decrease in the interstitial concentration.

Figure 4:
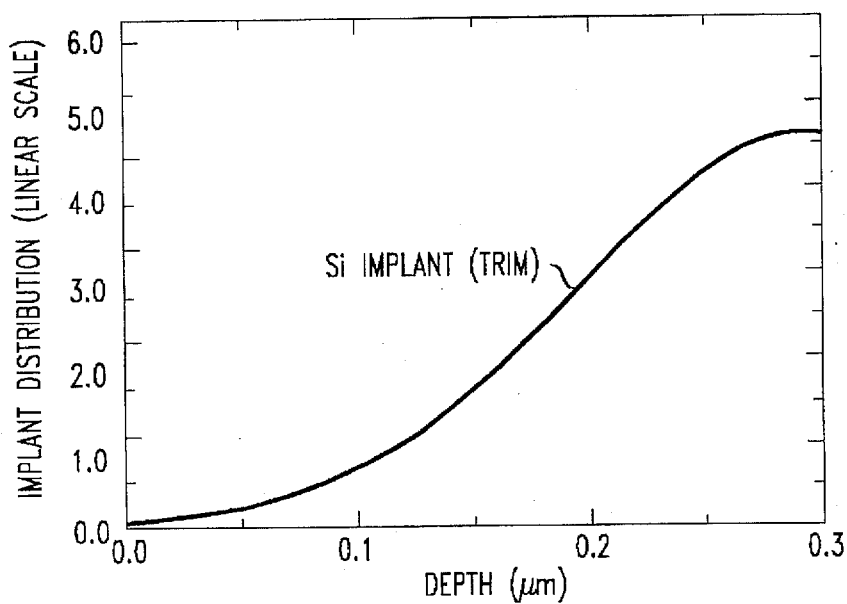
FIG. 4 graphically depicts the distribution of damage as a result of the silicon implant.
Figure 5:
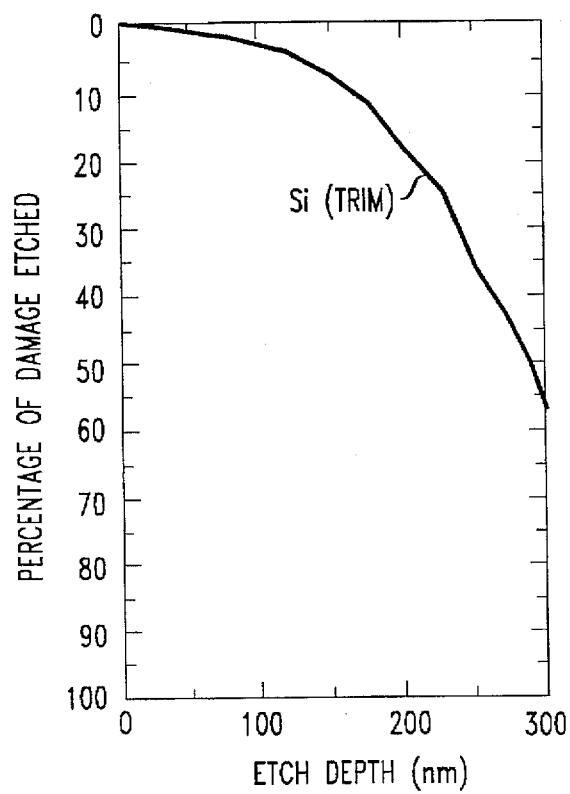
FIG. 5 graphically depicts the percentage of damage being etched away as the surface is brought closer to the damage.

The damage distribution of the silicon implant can be obtained via a Transport Of Ions In Matter (TRIM) simulation, as discussed in J. F. Zeigler et al., "The Stopping and Range of Ions in Solids", Pergamon Press, New York, 1987, incorporated herein by reference for all purposes. FIG. 4 shows the result of the TRIM simulation. As shown, the distribution was normalized and plotted as a function of etch depth. By knowing the amount of damage spatially distributed in the sample, the amount of damage reduction resulting from etching the surface to that depth can be determined. Referring to FIG. 5, the percentage in reduction of damage is plotted as a function of etch depth. From FIG. 5, it is shown that etching the surface to a depth of 2500 Å reduced the damage by a factor of 1.7, that is, removal of less than half the silicon damage. As discussed above, this factor should be six. Since surface proximity to the damage is the only other variable which depends on the etch depth, the surface must be acting as a strong sink for interstitials which reduces the number of interstitials available to facilitate transient diffusion. Thus, the above example shows that TED can be reduced by bringing the surface closer to the damage.

While the invention has been particularly shown and described with reference to various embodiments, it will be recognized by those skilled in the art that modifications and changes may be made to the present invention without departing from the spirit and scope thereof. The scope of the invention should, therefore, be determined not with reference to the above description, but instead should be determined with reference to the appended claims along with their full scope of equivalents.

We claim:

1. A process for reducing the transient enhanced diffusion of ion-implanted impurity atoms comprising the steps of:

implanting a region of a semiconductor material with a dose of impurity atoms having an average depth ($R_p$) within the semiconductor material;

removing an amount of a surface of the region, the amount is between about 10% of $R_p$ to $R_p$; and annealing said semiconductor material to remove damage caused by implanting step.

2. The process recited in claim 1 wherein the amount of the surface removed is between about 10 to 80 percent of $R_p$.

3. The process recited in claim 1 wherein the amount of the surface removed is between about 20 to 80 percent of $R_p$.

4. The process recited in claim 1 wherein the amount of the surface removed is between about 30 to 70 percent of $R_p$.

5. The process recited in claim 1 wherein the impurity atoms comprises boron (B).

6. The process recited in claim 1 wherein the impurity atoms is selected from a group consisting of boron (B), phosphorus (P), arsenic (As), and antimony (Sb).

7. The process recited in claim 1 wherein the surface is removed by reactive ion etching.

8. The process recited in claim 1 wherein the surface is removed by a technique selected from the group consisting of reactive ion etching, reactive sputter etching, reactive ion beam etching, wet etching, and microwave plasma etching.

\* \* \* \* \*